United States Patent [19]

Nishimura et al.

[11] Patent Number: 5,159,192
[45] Date of Patent: Oct. 27, 1992

[54] ENCODER AND SCANNING SYSTEM USING A SCALE HAVING A NON-UNIFORM PITCH

[75] Inventors: Tetsuharu Nishimura, Kawasaki; Koh Ishizuka, Urawa, both of Japan

[73] Assignee: Canon Kabushiki Kaisha, Tokyo, Japan

[21] Appl. No.: 641,891

[22] Filed: Jan. 16, 1991

[30] Foreign Application Priority Data

Jan. 20, 1990 [JP] Japan .................................. 2-11532

[51] Int. Cl.⁵ .............................................. G01D 5/34
[52] U.S. Cl. ............................. 250/231.16; 250/230; 250/237 G
[58] Field of Search ............. 250/230, 231.13, 231.14, 250/231.15, 231.16, 231.17, 231.18, 232, 233, 237 G, 235, 236; 33/1 PT; 358/494; 359/15, 17, 18, 566, 569, 573, 575, 196, 212, 213, 214

[56] References Cited

U.S. PATENT DOCUMENTS

| | | | |
|---|---|---|---|
| 4,263,506 | 4/1981 | Epstein | 250/231.17 |
| 4,714,830 | 12/1987 | Usui | 250/234 |
| 4,810,064 | 3/1989 | Azusawa et al. | 250/331 |
| 4,829,342 | 5/1989 | Nishimura . | |
| 4,868,385 | 9/1989 | Nishimura . | |
| 4,874,941 | 10/1989 | Spillman, Jr. | 250/237 G |
| 4,928,008 | 5/1990 | Huggins et al. | 250/237 G |

Primary Examiner—David C. Nelms
Assistant Examiner—John R. Lee
Attorney, Agent, or Firm—Fitzpatrick, Cella, Harper & Scinto

[57] ABSTRACT

A rotary encoder and a scanning system using the same for detecting rotation of a galvano scanner which comprises a rotary scale coupled to a rotating driver, a scale with slits formed at a non-uniform pitch circumferentially on the rotary scale within a limited rotation angle and detection means for detecting a rotation status by reading the slits.

24 Claims, 6 Drawing Sheets

N: NUMBER OF OUTPUT SIGNALS FROM PHOTOSENSING ELEMENT

ENCODER AND SCANNING SYSTEM USING A SCALE HAVING A NON-UNIFORM PITCH

BACKGROUND OF THE INVENTION

1. Field of the Invention

The present invention relates to an angle detection device such as an encoder, and more particularly to a device for detecting a rotation angle of a rotary reflection mirror for scanning a light beam from a light source such as a laser on a screen surface by a galvano scanner having the rotary reflection mirror.

2. Related Background Art

In a device for reflecting a light beam from a light source such as a laser beam by a rotary reflection mirror or a so-called galvano mirror and scanning a screen surface by the light beam, an encoder which detects a rotation angle of the rotary reflection mirror to control the drive of the rotary reflection mirror is usually used. It is disclosed, for example, in U.S. Pat. No. 4,829,342 and U.S. Pat. No. 4,868,385.

FIG. 6 shows a schematic view of such a prior art device. Numeral 1 denotes a rotary reflection mirror which is coupled to a driver 3 such as a motor by a rotary shaft 2. Numeral 4 denotes a display screen and numeral 5 denotes a light source such as a laser.

A light beam K from the laser 5 is directed to the display screen 4 through the rotary reflection mirror 1. The rotary reflection mirror 1 is rotated by the driver 3 so that the reflected light beam from the rotary reflection mirror 1 scans the display screen 4.

An angle sensor (not shown) for detecting a rotation angle of the rotary reflection mirror 1 (rotary shaft 2) is provided in the driver 3 so that the angle sensor produces an angular signal which is proportional to the rotation angle of the rotary reflection mirror 1.

The angular signal together with an input signal through a coordinate correction computer are fed back to a drive signal of the driver 3 to control the drive of the rotation of the rotary shaft 2.

However, the device shown in FIG. 6 has the following problem. FIG. 7 shows a partial plan view of FIG. 6. It shows the laser beam K and the rotary reflection mirror 1, and an incident position of the laser beam K on the display screen 4.

If the rotary reflection mirror 1 is rotated by an angle $\theta$, the laser beam K is deflected by the rotary reflection mirror 1 by an angle $2\theta$. The incident position of the laser beam K on the display screen 4, that is, a depiction point $Y_1$ is given by $$Y_1 = L \cdot \tan 2\theta \quad (1)$$

where L is a distance from a center of rotation of the rotary reflection mirror 1 to the display screen 4.

Similarly, if the rotary reflection mirror 1 is rotated by an angle $2\theta$, the depiction point on the display screen 4 is given by $$Y_2 = L \cdot \tan 4\theta \quad (2)$$

Accordingly, a distance $\Delta Y$ between the depiction points $Y_1$ and $Y_2$ is given by $$\begin{aligned} \Delta Y &= Y_2 - Y_1 \\ &= L(\tan 4\theta - \tan 2\theta) \\ &= Y_1/\cos 4\theta \end{aligned} \quad (3)$$

Thus the depiction positions $Y_1$ and $Y_2$ are not equi-spaced with respect to the rotation angle.

As a result, as shown in FIG. 8, even if the rotary reflection mirror 1 is rotated by a constant angular pitch $\theta$, the depiction points Y on the display screen 4 are not equi-spaced.

A prior art angle detector used for the driver 3 usually produces a signal which is proportional to the rotation angle. Thus, there is no linear relation between the angular signal of the angle detector and the display screen 4.

Accordingly, in the prior art device, it is necessary to compensate for the linearity of the depiction points by the coordinate correction computer as shown in FIG. 6, and a signal processing circuit of the device is complex.

SUMMARY OF THE INVENTION

It is an object of the present invention to provide an encoder which maintains a linear relation between a detection signal of the encoder which detects a rotation angle of a rotary reflection mirror and a light beam irradiation point on a scanned screen of a light beam scanned by the reflection mirror, and a scale for the encoder.

It is another object of the present invention to provide a system which simplifies a signal processing circuit by using the above encoder.

DETAILED DESCRIPTION OF THE PREFERRED EMBODIMENTS

Figure 1:
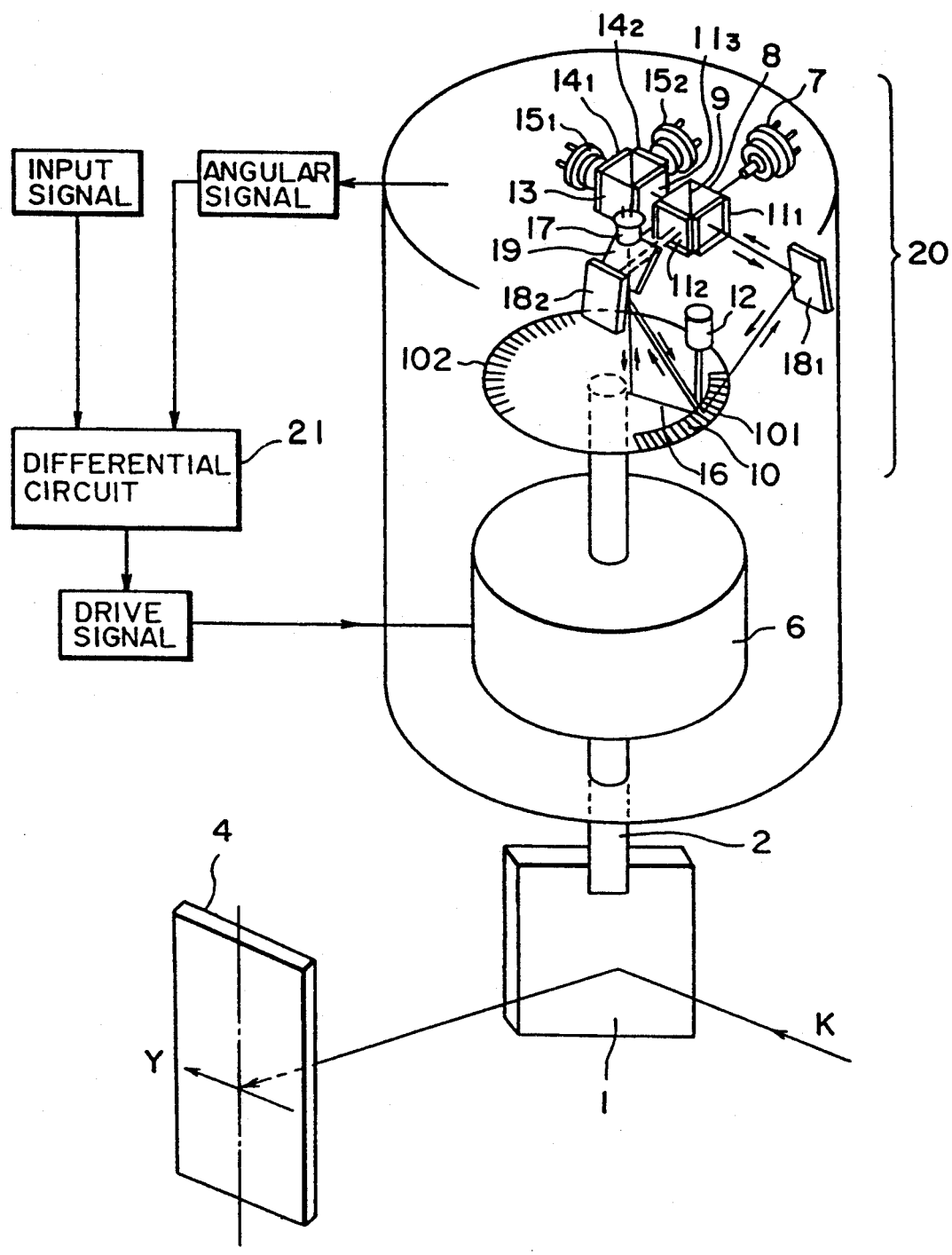
FIG. 1 shows a schematic view of major portions of an embodiment of the present invention.

FIG. 1 shows a schematic view of major portions of one embodiment of a galvano scanner of the present invention. Numeral 4 denotes a display screen and numeral 5 denotes a laser. Numeral 1 denotes a rotary reflection mirror (galvano mirror) which reflects a beam from the laser 5 to the screen 4 which is a target. The rotary reflection mirror 1 is coupled to a driver 6 such as a motor by a rotary shaft 2. Numeral 20 denotes detection means which detects a rotation angle of the rotary shaft 2 or the rotary reflection mirror 1. Numeral 21 denotes a differential circuit which receives an output signal from the detection means 20 and an input signal from input means (not shown) which inputs a rotation status. The differential circuit 21 supplies a drive signal for controlling the rotation of the rotary shaft 2 in accordance with those signals to the driver 6. No optical system such as an f-$\theta$ lens is provided between the rotary reflection mirror 1 and the screen 4, as shown.

The detection means 20 for optically detecting the rotation status is now explained.

Figure 2:
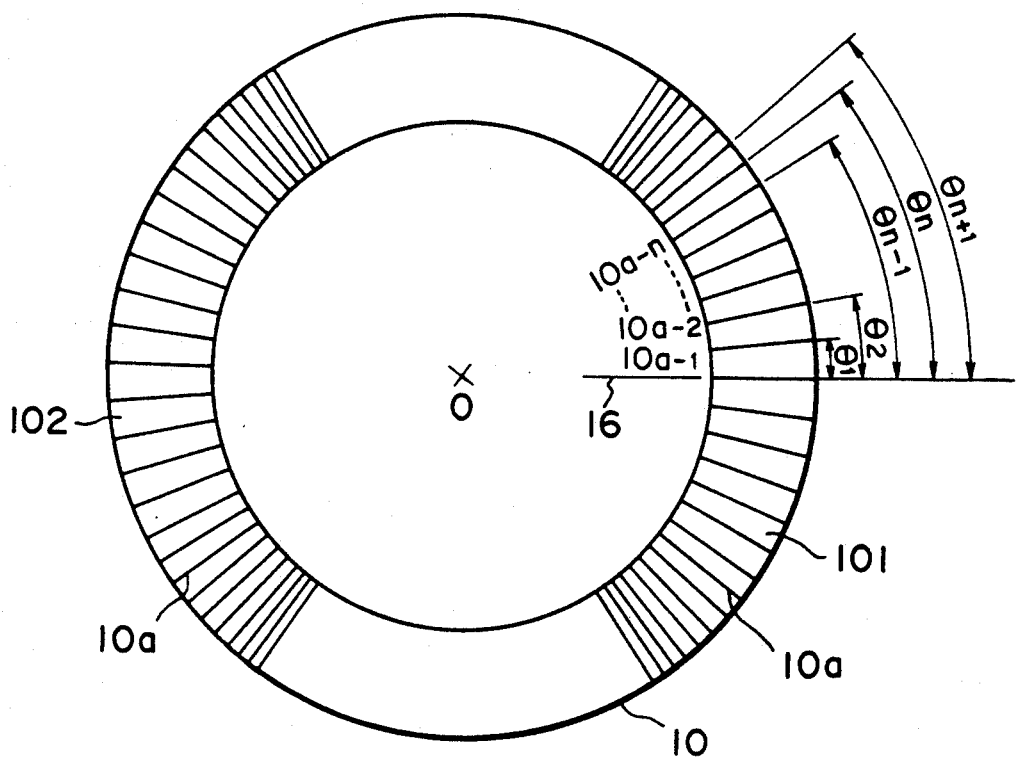
FIG. 2 shows a detailed view of a rotary scale of FIG. 1.

Numeral 10 denotes a rotary scale which is supported by the rotary shaft 2. FIG. 2 shows a plan view of one embodiment of the rotary scale 2. As shown, the rotary scale 10 has two slit arrays 101 and 102 each having a plurality of slits 10a arranged circumferentially. In the present embodiment, the slit array 102 is not always necessary but it is necessary in an embodiment shown in FIG. 4. Numeral 16 denotes a reference slit which is used as an origin point. Only a center axis of the slits is shown.

The slits 10a are arranged at a non-uniform pitch within a limited angular range to meet the condition:

$$\tan 2\theta_{n+1} - \tan 2\theta_n = \tan 2\theta_n - \tan 2\theta_{n-1} \quad (4)$$

where $\theta_1$ is an angle of the first slit 10a-1 as counted from the reference slit 16, $\theta_2$ is an angle of the second slit 10a-2, ..., $\theta_{n-1}$ is an angle is angle of the (n−1)th slit 10a-(n−1), $\theta_n$ is an angle of the n-th slit 10a-n, and $\theta_{n+1}$ is an angle of the (n+1)th slit 10a-(n+1).

The rotary scale 10 of the present embodiment has a number of shadings made of a chromium (Cr) film arranged on a glass substrate. The term slits herein means light transmitting areas between the chromium (Cr) film shadings. Where the rotary scale 10 is manufactured by a metal plate, holes (slits) of a constant pitch may be formed on the metal plate by etching. Other metal than chromium (Cr) such as copper (Cu), aluminum (Al) or silver (Ag) may be used.

The rotary scale 10 may also have its scale formed by uneven cross-sectional contour or a so-called phase type grating.

The two slit arrays 101 and 102 are arranged symmetrically with regard to the center of rotation of the rotary scale 10. The slits 10a of each of the two slit arrays 101 and 102 have a sufficiently line pitch to diffract an incident light beam by the slits. Thus, the slits have the same optical function as that of a diffraction grating.

In the present embodiment, a coherent light beam from a semiconductor laser 7 is directed to a polarization prism 8 having a polarization beam splitter 9 to split it into a linearly polarized transmitted light beam (white line) and a linearly polarized reflected light beam (black line). The mount position of the laser 7 is controlled such that a direction of the linear polarization of the exit light beam of the laser 7 is 45 degrees with respect to the polarization beam splitter 9. Thus, a ratio of intensities of the transmitted light beam and the reflected light beam from the polarization beam splitter 9 is substantially unity.

The reflected light beam and the transmitted light beam from the polarization beam splitter 9 pass through quarter wavelength plates $11_1$ and $11_2$ so that they are circularly polarized, and they are reflected by reflection mirrors $18_1$ and $18_2$ and directed to the slit array 101 in such a manner that an m-order diffracted light from the slit array 101 is reflected substantially perpendicularly by the rotary scale 10.

Namely, they are directed at an incident angle $\theta_m$ with respect to the slit array 101

$$\theta_m \approx \sin^{-1}(m\lambda/P) \quad (a)$$

where P is an average pitch of the slits 10a of the slit array 101, $\lambda$ is a wavelength of the coherent light beam and m is an integer.

The m-order diffracted light exited substantially perpendicularly from the slit array 101 is directed to a reflecting optical system 12 which may comprise a cat-eye optical system. Since a reflection film is formed in a vicinity of a focal plane of the reflecting optical system 12, the incident light beam is reflected by the relfection film and then returns along the previous light path, exits from the reflecting optical system 12 and is again directed to the slit array 101.

The m-order reflected diffracted light which was again diffracted by the slit array 101 is reflected by the reflection mirrors $18_1$ and $18_2$, passes through the quarter wavelength plates $11_1$ and $11_2$ and is again directed to the polarization beam splitter 9.

Since the rediffracted light has gone back and both the quarter wavelength plates $11_1$ and $11_2$, the polarization direction of the light beam first reflected by the polarization beam splitter 9 is 90 degrees different from that of the polarization beam splitter 9 when it is redirected. Accordingly, it passes through the beam splitter 9. On the other hand, when the light beam first transmitted through the polarization beam splitter 9 is redirected, it is reflected.

In this manner, the two diffracted lights are superimposed by the polarization beam splitter 9, and it passes through the quarter wavelength plate $11_3$ and is converted to a circularly polarized light beam, and it is slit into two light beams by a beam splitter 13. They pass through polarization plates $14_1$ and $14_2$ to produce linearly polarized lights which are directed to photosensing elements $15_1$ and $15_2$.

The polarization directions of the polarization plates $14_1$ and $14_2$ are staggered by 45 degrees and the photosensing elements $15_1$ and $15_2$ produce sine waves having a phase difference of 90 degrees. Numeral 19 denotes a half-mirror which reflects a portion of the light beam and directs it to the inner side of the slit arrays of the rotary scale 10. A photosensing element 17 detects the reflected light which varies with the reference slit 16 for the origin point to produce an origin point signal.

The angle $\theta_m$ in the formula (1) indicates that it should be within such a range that the diffracted light is directed to the reflecting optical system 12 and redirected to the slit array 101.

In the present embodiment, the phase of the m-order diffracted light changes by $2m\pi$ as the slit moves by one pitch. Accordingly, since the photosensing elements $15_1$ and $15_2$ sense the interference of the light beams which have suffered the positive and negative m-order diffractions twice, respectively, 4m sine waves are produced when the slits of the slit array move by one pitch.

In the present embodiment, the light beam is split into two light beams by the beam splitter 13 and the phase difference of 90 degrees is imparted to those light beams so that the direction of rotation of a rotating object may also be determined.

Figure 3:
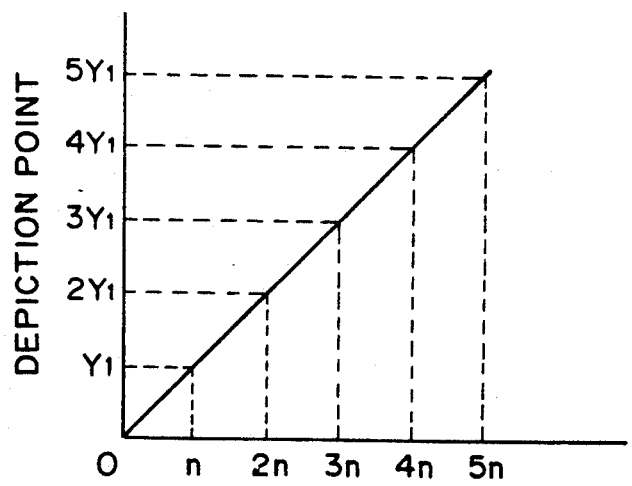
FIG. 3 shows a relationship between an angular signal produced by the encoder of the present invention and a depiction point.

In the present embodiment, since the slit arrays 101 and 102 are arranged to meet the formula (4), a linear relation as shown in FIG. 3 is assured between the number of signal outputs N of the photosensing elements $15_1$ and $15_2$ and the depiction point Y on the scanned screen 4 as the rotary reflection mirror 1 is rotated. Where a distance from the center of rotation of the rotary reflection mirror 1 when the ±1-order diffracted light (m=1) is used to the screen is 100 mm, and a spacing between the depiction points on the screen 4 per angular detection signal is 10 μm, the rotation angle φ of the rotary reflection mirror 1 per pulse is given by $$\phi = \tan^{-1}(10/100000)/2 = 0.0028648°$$

For the ±1-order diffracted light (m=1), the pitch of the slits is divided into four. Thus, the arrangement of the slits in the slit arrays 101 and 102 is done to meet the following formula.

$$\theta = 4 \times \phi = 0.0114592°$$

$$\tan 2\theta_{n+1} - \tan 2\theta_n = \tan 2\theta_n - \tan 2\theta_{n-1} \qquad (5)$$

The formula (5) is expressed as $$\tan 2\theta_n = n \tan 2\theta_1 = 0.0004 \times n \qquad (6)$$

A relation among a slit array number, the slit angle $\theta_n$, the number N of signal outputs and the depiction points Y on the screen 4 is shown on Table 1. As shown, in accordance with the present embodiment, the linearity between the number N of signal outputs produced by the detection means and the depiction points Y on the screen 4 is assured.

TABLE 1

| Slit Array Number n | Slit Angle $\theta_n$ degree | Number of Signal Outputs N | Depiction Point Y μm |
|---|---|---|---|
| 0 | 0.0000000 | 0 | 0 |
| 1 | 0.0114592 | 4 | 40 |
| 100 | 1.1453050 | 400 | 4000 |
| 101 | 1.1567457 | 404 | 4040 |
| 1000 | 10.9007047 | 4000 | 40000 |
| 1001 | 10.9105820 | 4004 | 40040 |
| 2000 | 19.3299041 | 8000 | 80000 |
| 2001 | 19.3368901 | 8004 | 80040 |
| 3000 | 25.0972145 | 12000 | 120000 |
| 3001 | 25.1019099 | 12004 | 120040 |
| 4000 | 28.9973084 | 16000 | 160000 |
| 4001 | 29.0005267 | 16004 | 160040 |

Figure 4:
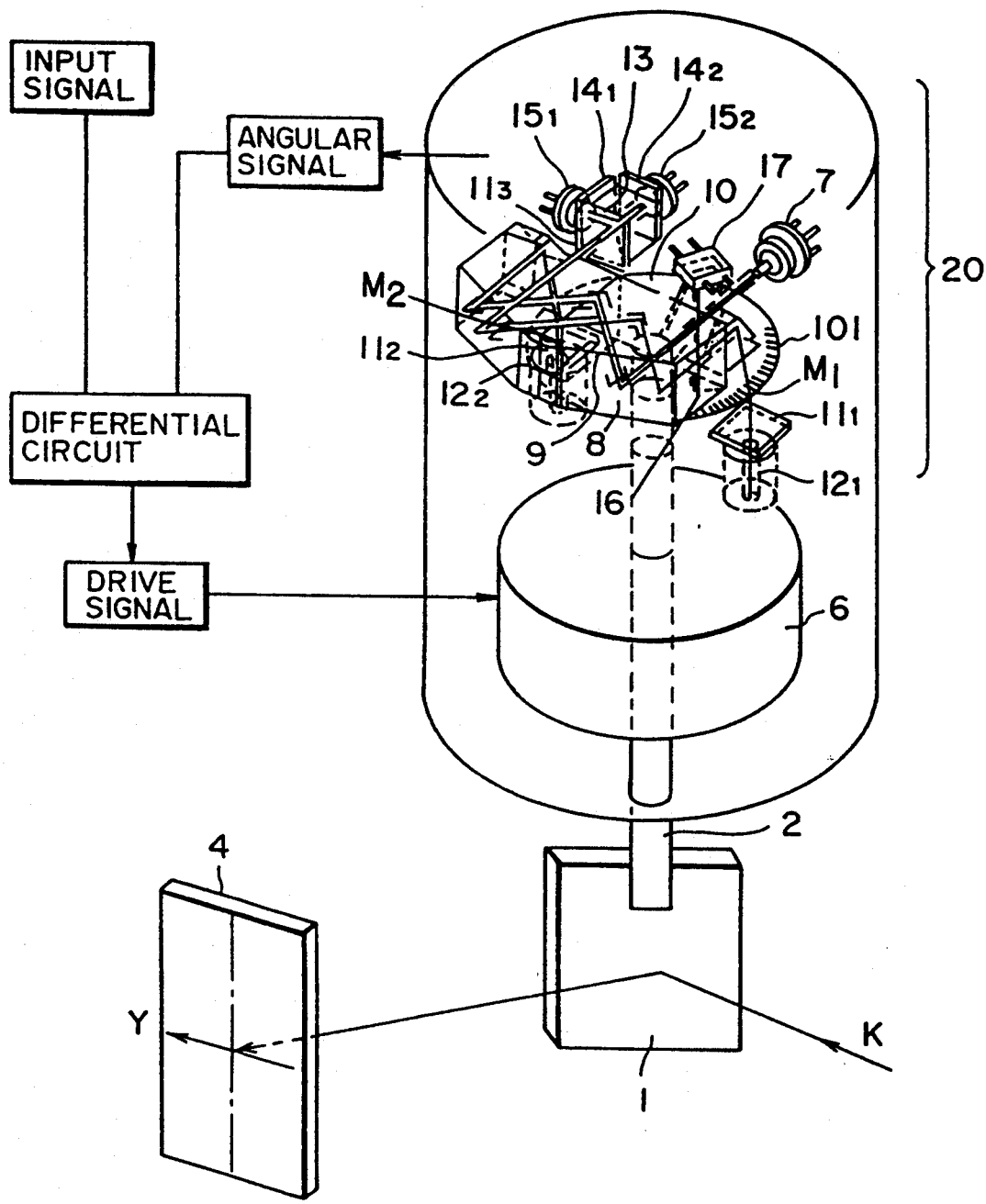
FIG. 4 shows another embodiment of the present invention.

FIG. 4 shows a schematic view of major portions of another embodiment of the present invention. The like numerals to those shown in the embodiment of FIG. 1 designate the like elements. The basic configuration of the present embodiment is essentially similar to that of the embodiment of FIG. 1, but, in the present embodiment, light beams are directed to two points $M_1$ and $M_2$ which are substantially symmetric with regard to the center of rotation of the rotary shaft 2 and the diffracted lights from the slit arrays 101 and 102 are utilized to reduce a measurement error due to the eccentricity of the center of rotation of the rotating object from the centers of the radially arranged slit arrays 101 and 102.

In the present embodiment, a light beam emitted by a laser 7 is directed to a polarization prism 8 having a polarization beam splitter 9 to split the light beam into two equal intensity linearly polarized light beams, a reflected light beam and a transmitted light beam. The reflected light beam (black line) is directed to the point $M_1$ at which a radial slit array 101 is arranged on a rotary scale 10 coupled to the rotating object. A diffracted light of a specific order of the transmitted diffracted light directed to and diffracted by the slit array 101 is reflected by a reflecting optical system $12_1$ through a quarter wavelength plate $11_1$, and it is returned along the same light path through the quarter wavelength plate $11_1$ and directed again to the substantially same position $M_1$ on the slit array 101. The diffracted light of the specific order rediffracted by the slit array 101 is converted to a linearly polarized light whose polarization direction is 90 degrees different from that of the incident light, and it is directed to the polarization prism 8.

In the present embodiment, the forward and backward light paths of the diffracted light of the specific order extending from the polarization beam splitter 9 to the reflecting optical system $12_1$ are identical.

The transmitted light beam (white line) of the two light beams split by the polarization prism 8 is directed to the point $M_2$ which is substantially symmetric to the point $M_1$ on the slit array 102 on the rotary scale 10 with regard to the rotary shaft 2. The diffracted light of the specific order of the transmitted diffracted light directed to and diffracted by the slit array 102 is returned along the same light path by a reflecting optical system $12_2$ which is similar to the reflecting optical system $12_1$ through a quarter wavelength plate $11_2$, and directed again to the substantially same position $M_2$ of the slit array $10_2$ through the quarter wavelength plate $11_2$. The diffracted light of the specific order rediffracted by the slit array 102 is converted to a linearly polarized light whose polarization angle is 90 degrees different from that of the incident light, and it is directed to the polarization prism 8.

Like the reflected light beam, the transmitted light beam has a common forward and backward light path for the diffracted light of the specific order extending from the polarization beam splitter 3 to the reflecting optical system $12_2$. It is superimposed on the diffracted light directed through the reflecting optical system $12_1$ and directed to a quarter wavelength plate $11_3$ to convert it to a circularly polarized light, which is split into two light beams by a beam splitter 13. They are directed to polarization plates $14_1$ and $14_2$ having their polarization directions inclined by 45 degrees from each other to produce linearly polarized lights having a phase difference of 90 degrees therebetween. They are directed to photosensing means $15_1$ and $15_2$, respectively. An intensity of an interference fringe of the two light beams formed by the photosensing means $15_1$ and $15_2$ is detected.

In the present embodiment, when the rotating object rotates by one pitch of the slits, a phase of the n-order diffracted light changes by 2mπ. Similarly, a phase of the m-order diffracted light rediffracted by the slit array 102 changes by 2mπ. Accordingly, 4m sine waves are produced by the photosensing means.

In the present embodiment, those sine waves are detected to detect the rotation angle of the rotary shaft 2 or the rotary reflection mirror 1 as it is done in the embodiment of FIG. 1.

In the device described above, a so-called diffracted light interference system in which the rotation angle of the rotary scale 10 is detected based on the change in the intensity of the interference light formed by the pair of diffracted lights from the rotary scale 10 is used. However, the present invention is not limited to such a detection system. For example, well-known main scale and index scale may be arranged to face each other and lights transmitted through gratings of those scales may be photoelectrically converted to detect the rotation angle. In this case, the rotary scale 10 of the above embodiment may be used as the main scale and a scale having a single slit (shading) may be used as the index scale to attain more exact detection of the rotation angle.

The scale read method is not limited to optical but a magnetic or electrostatic detection method may be used.

As described above, since the slit arrays comprising a plurality of slits on the rotary scale are arranged to meet the above formula, the linear relation between the rotation angle detection signal of the rotary shaft or the rotary reflection mirror and the light beam irradiation position on the target which is the scanned plane is maintained, and the need for the correction of the input signal to the driver is eliminated and the simplification of the signal processing circuit is attained.

Further, since the two slit arrays are arranged symmetrically with regard to the center of rotation of the rotary shaft, the angle detection error due to the mounting eccentricity of the slit arrays to the rotary shaft is corrected and the high precision angle detection is attained.

The galvano scanner described above can be applicable to various systems. For example, it is applicable to an image forming system such as an image recorder, as image reader or image display, an information recording and reproducing system which records and reproduces information to and from an information recording medium such as a magneto-optical memory, and a semiconductor system such as a memory repair.

Figure 5:
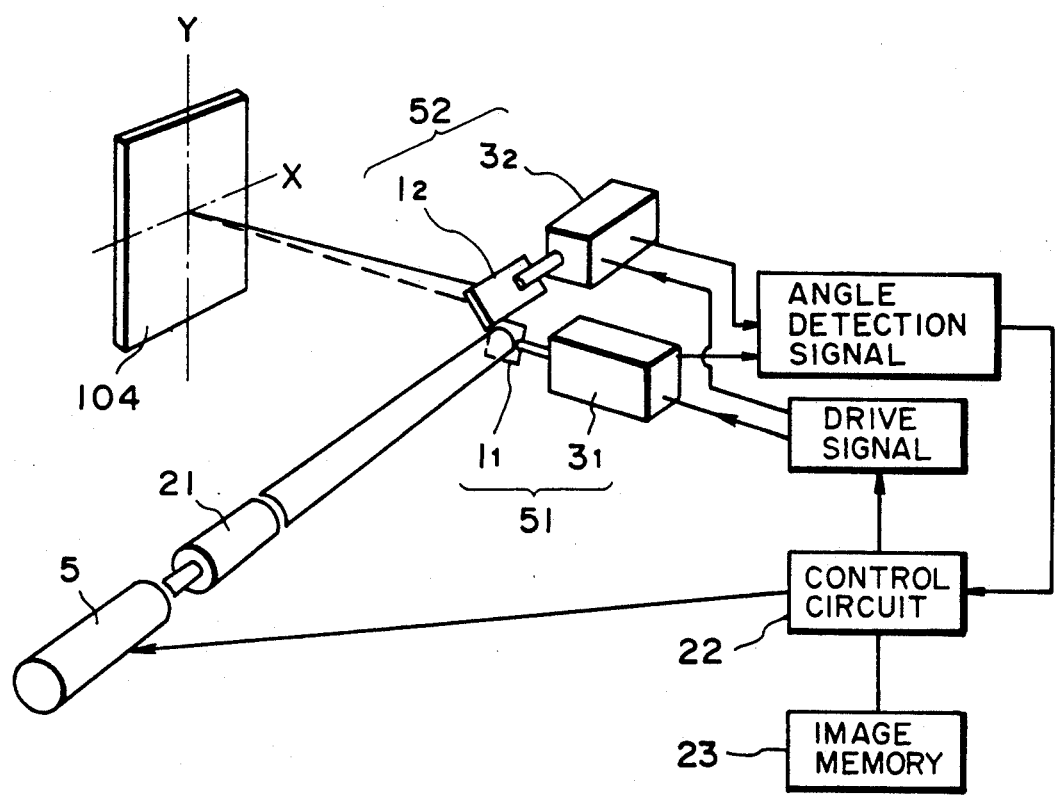
FIG. 5 shows a system configuration of an embodiment in which the present invention is applied to an X-Y display device.
Figure 6:
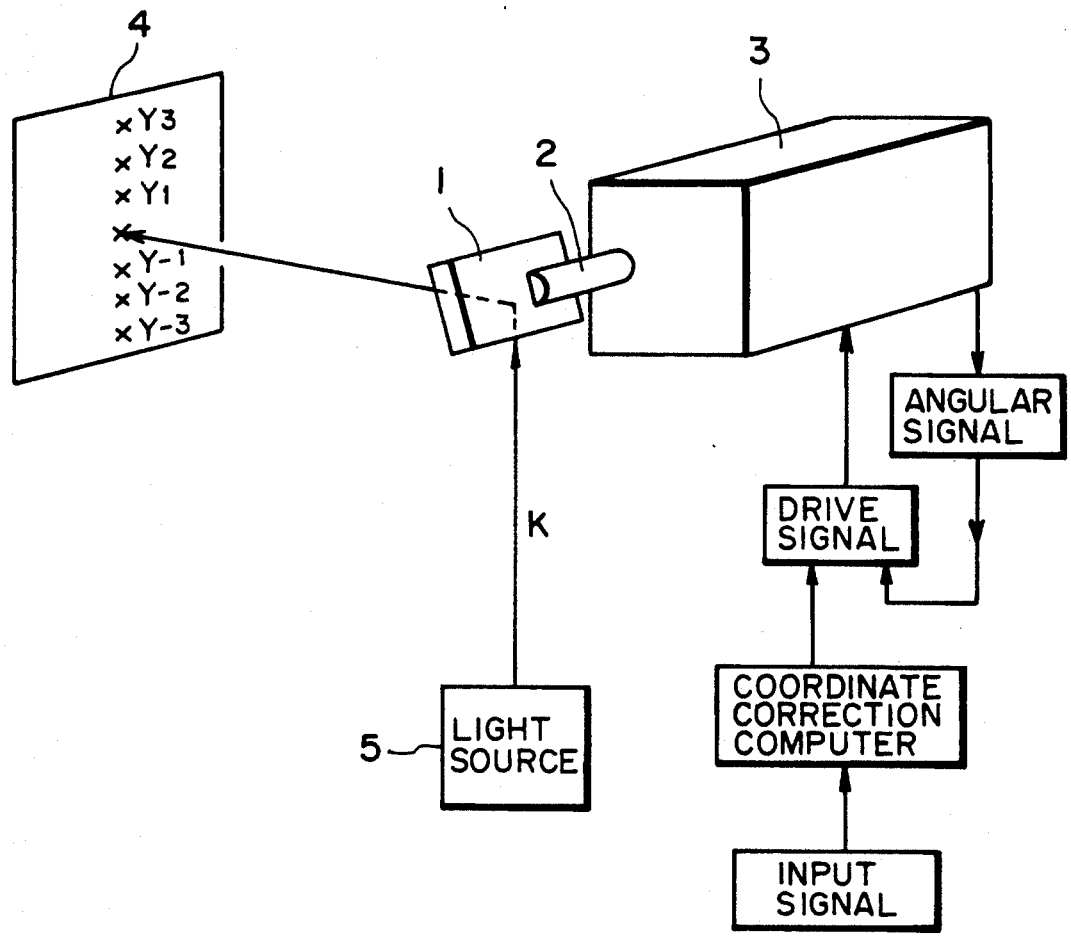
FIG. 6 shows a prior art configuration.
Figure 7:
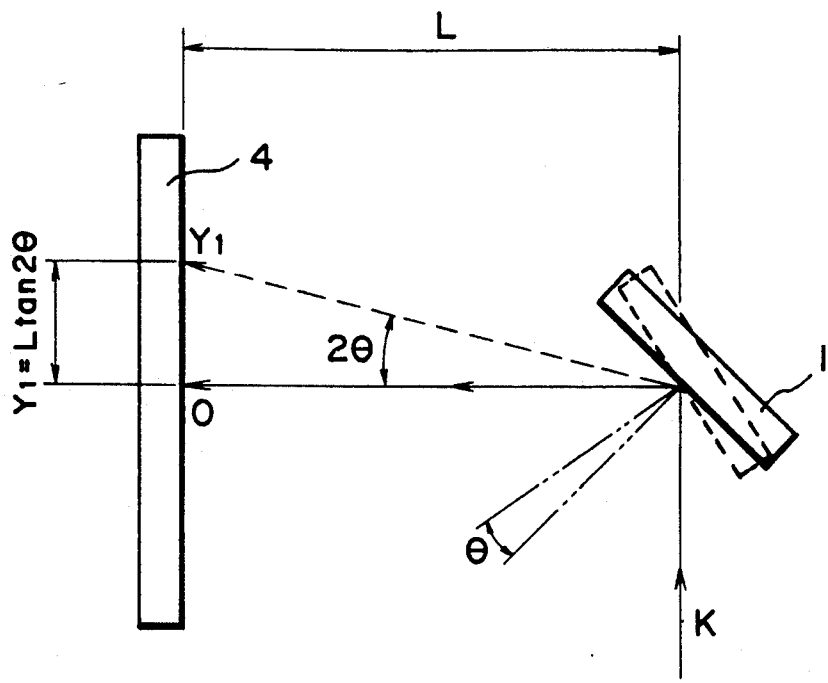
FIG. 7 shows a portion of FIG. 6.
Figure 8:
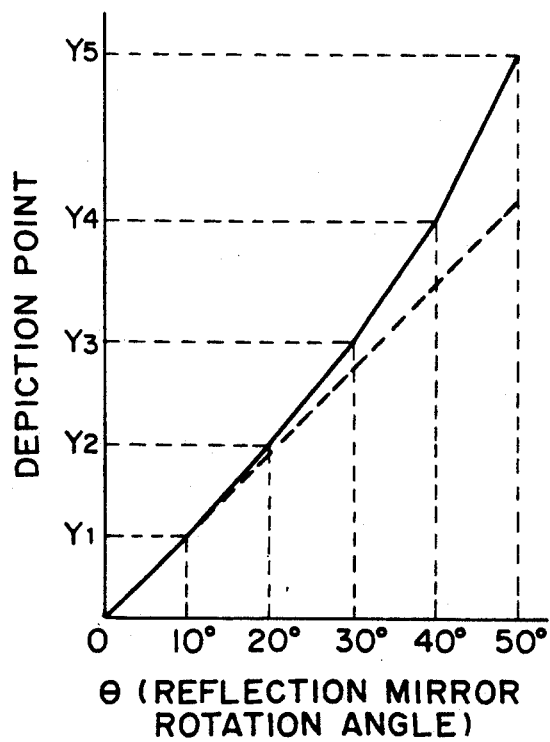
FIG. 8 shows a relationship between an angular signal produced by the prior art encoder and a depiction point.

FIG. 5 shows a system configuration of an embodiment in which the above galvano scanner is applied to a two-dimensional display device which displays an image by scanning a beam in X and Y directions. A beam source 5 such as a laser which emits an energy beam is modulated by the image data to emit a modulated beam. The beam passes through a focusing lens 21 and is scanned in X and Y directions on a screen 104 (for example, an electronic slide having a liquid crystal valve) to display a two-dimensional image on the screen 104. The scanners 51 and 52 are configured as shown in FIGS. 1 or 4. A control circuit 22 controls the drive of the scanners 51 and 52 and also modulates the beam source 5. An angular signal produced by an encoder of each scanner is fed back, and pixel data to be displayed at the scan position of the beam is read from an image memory 24 and the beam source 5 is modulated based on the pixel data. Instead of directly modulating the beam source, a modulation element such as an A/O device may be arranged in a light path to modulate the beam.

In the system of the present embodiment, since the relation between the count of the angle detection system as the rotary reflection mirrors $1_1$ and $1_2$ of the X and Y scanners 51 and 52 rotate and the image display position on the screen 104 are kept linear, the signal processing circuit does not need the coordinate correction computer which was required in the prior art device and the system configuration is simplified.

Where a recording medium such as a film is arranged on the screen 104, the image may be recorded on the film to produce a hard copy.

What is claimed is:

1. A rotary scale used for a rotary encoder for detecting rotation of a galvano scanner, comprising:
   a rotary scale; and
   a scale formed on said rotary scale, said scale having a plurality of slits formed on said rotary scale within a limited rotation angle, said slits being arranged so that a linear relation between a read signal of the slit and a beam irradiation position on a scanning plane is maintained.

2. A rotary scale according to claim 1, wherein a reference slit is provided on said rotary scale separately from said plurality of slits.

3. A rotary scale according to claim 1, wherein said respective slits meet a relation of $$\tan 2\theta_{n+1} - \tan 2\theta_n = \tan 2\theta_n - \tan 2\theta_{n-1}$$

where $\theta_n$ (n=0, ±1, ±2, ±3, ...) is an angle formed between an n-th slit and a 0-th slit.

4. A rotary scale according to claim 1, wherein two slit arrays are arranged symmetrically with regard to a center of rotation of said rotary scale.

5. A rotary scale according to claim 1, wherein said slits function as a diffraction grating.

6. A rotary encoder for detecting rotation of a galvano scanner, comprising:
   a rotary scale coupled to a rotating driven portion;
   a scale formed on said rotary scale, said scale having a plurality of slits formed circumferentially on said rotary scale within a limited rotation angle, said slits being arranged so that a linear relation between a read signal of the slit and a beam irradiation position on a scanning plane is maintained; and
   detection means for detecting a rotation status by reading said slits.

7. A rotary encoder according to claim 6, wherein said respective slits meet a relation of $$\tan 2\theta_{n+1} - \tan 2\theta_n = \tan 2\theta_n - \tan 2\theta_{n-1}$$

where $\theta_n$ (n=0, ±1, ±2, ±3, ...) is an angle formed between an n-th slit and an 0-th slit.

8. A rotary encoder according to claim 6, wherein said detection means includes a light source for emitting a light to be irradiated to said slits, and a photosensing element for detecting a modulated light from the slits.

9. A rotary encoder according to claim 6, wherein two slit arrays are arranged symmetrically with regard to a center of rotation of said rotary scale, and said detection means detects a modulated light at two symmetrical points on the rotary scale.

10. A rotary encoder according to claim 8, wherein said detection means detects an interference light generated by a diffracted light from the slits functioning as a diffraction grating.

11. A galvano scanner apparatus, comprising:
    a rotating drive source:
    a mirror coupled to said rotating drive source for scanning a beam;
    a rotary scale for detecting a rotation status of said rotating drive source;
    a scale formed on said rotary sink, said scale having a plurality of slits formed circumferentially on said rotary scale within a limited rotation angle, said slits being arranged so that a linear relation between a read signal of the slit and a beam irradiation position on a scanning plane is maintained; and
    detection means for detecting a rotation status of said mirror by reading said slits.

12. A galvano scanner apparatus according to claim 11, wherein said respective slits meet a relation of $$\tan 2\theta_{n+1} - \tan 2\theta_n = \tan 2\theta_n - \tan 2\theta_{n-1}$$

where $\theta_n$ (n=0, ±1, ±2, ±3, ...) is an angle formed between an n-th slit and a 0-th slit.

13. A galvano scanning system, comprising
a beam source for generating a beam;
a target to which the beam is irradiated; and
a scanner for scanning the beam on said target;
said scanner including;
a rotating drive source;
a mirror coupled to said rotating drive source for scanning a beam;
a rotary scale for detecting a rotation status of said rotating drive source;
a scale formed on said rotary scale, said scale having a plurality of non-uniform slits formed circumferentially on said rotary scale within a limited rotation angle, said slits being arranged so that a linear relation between a read signal of the slit and a beam irradiation position on a scanning plane is maintained; and
detection means for detecting a rotation status of said mirror by reading said slits.

14. A galvano scanning system according to claim 13, wherein said respective slits meet a relation of $$\tan 2\theta_{n+1} - \tan 2\theta_n = \tan 2\theta_n - \tan 2\theta_{n-1}$$

where $\theta$ (n=0, ±1, ±2, ±3, ...) is an angle formed between an n-th slit and a 0-th slit.

15. A galvano scanning system according to claim 14, wherein said target is a display medium.

16. A galvano scanning system according to claim 14, wherein said target is a recording medium.

17. A galvano scanning system according to claim 16, wherein said recording medium is a film.

18. A galvano scanning system according to claim 16, wherein said recording medium is an optical memory.

19. A galvano scanning system according to claim 14, wherein said target is a semiconductor device.

20. A two-dimensional scanning system, comprising:
a beam source for generating a beam;
a first scanner for scanning the beam in an X direction on a target; and
a second scanner for scanning the beam in a Y direction on the target:
said first and second scanners each including:
a rotating drive source;
a mirror coupled to said rotating drive source for scanning the beam;
a rotary scale for detecting a rotation status of said rotating drive source;
a scale formed on said rotary scale, said scale having a plurality of non-uniform slits formed circumferentially on said rotary scale within a limited rotation angle, said slits being arranged so that a linear relation between a read signal of the slit and a beam irradiation position on a scanning plane is maintained; and
detection means for detecting a rotation status of said mirror by reading said slits.

21. A two-dimensional scanning system according to claim 20, wherein said respective slits meet a relation of $$\tan 2\theta_{n+1} - \tan 2\theta_n = \tan 2\theta_n - \tan 2\theta_{n-1}$$

where $\theta$ (n=0, ±1, ±2, ±3, ...) is an angle formed between an n-th slit and a 0-th slit.

22. A two-dimensional display apparatus, comprising:
a beam source for generating a beam;
modulation means for modulating the beam;
a screen for forming a two-dimensional image thereon by the beam;
a first scanner for scanning the beam in an X direction on said screen;
a second scanner for scanning the beam in a Y direction on said screen; and
control means for controlling said first and second scanners and said modulation means;
said first and second scanners each including;
a rotating drive source;
a mirror coupled to said rotating drive source for scanning the beam;
a rotary scale for detecting a rotation status of said rotating drive source;
a scale formed on said rotary scale, said scale having a plurality of non-uniform slits formed circumferentially on said rotary scale plate within a limited rotation angle, said slits being arranged so that a linear relation between a read signal of the slit and a beam irradiation position on a scanning plane is maintained; and
detection means for detecting a rotation status of said mirror by reading said slits.

23. A two-dimensional display apparatus according to claim 22, wherein said screen includes an electronic slide.

24. A two-dimensional display apparatus according to claim 23, wherein said electronic slide includes a liquid crystal valve.

* * * * *

UNITED STATES PATENT AND TRADEMARK OFFICE
CERTIFICATE OF CORRECTION

PATENT NO. : 5,159,192

DATED : October 27, 1992

INVENTOR(S) : Tetsuharu Nishimura, et al.

It is certified that error appears in the above-identified patent and that said Letters Patent is hereby corrected as shown below:

COLUMN 3:

Line 27, "is angle" should be deleted.
    Line 45, "sufficiently" should read --sufficient--.

COLUMN 6:

Line 26, "$10_2$" should read --102--.

Signed and Sealed this

Sixteenth Day of November, 1993

*Attest:*

BRUCE LEHMAN

*Attesting Officer*     *Commissioner of Patents and Trademarks*